(12) United States Patent
Rey et al.

(10) Patent No.: US 9,490,825 B2
(45) Date of Patent: Nov. 8, 2016

(54) ADJUSTING TUNING SEGMENTS IN A DIGITALLY-CONTROLLED OSCILLATOR

(71) Applicant: Intel IP Corporation, Santa Clara, CA (US)

(72) Inventors: Claudio Rey, Tempe, AZ (US); David Harnishfeger, Chandler, AZ (US); Darin Nguyen, Phoenix, AZ (US)

(73) Assignee: Intel IP Corporation, Santa Clara, CA (US)

( * ) Notice: Subject to any disclaimer, the term of this patent is extended or adjusted under 35 U.S.C. 154(b) by 78 days.

(21) Appl. No.: 13/901,481

(22) Filed: May 23, 2013

(65) Prior Publication Data
US 2014/0347137 A1 Nov. 27, 2014

(51) Int. Cl.
*H03B 5/12* (2006.01)
*H03L 7/099* (2006.01)
*H03L 7/10* (2006.01)
*H03L 7/18* (2006.01)

(52) U.S. Cl.
CPC ............... *H03L 7/099* (2013.01); *H03B 5/124* (2013.01); *H03L 7/103* (2013.01); *H03L 7/18* (2013.01); *H03L 2207/06* (2013.01)

(58) Field of Classification Search
CPC ........ H03B 5/08; H03B 5/12; H03B 5/1203; H03B 5/1206; H03B 5/1209; H03B 5/1212; H03B 5/1215; H03B 5/1228; H03B 5/1231; H03B 5/1237; H03B 5/124; H03B 5/1243; H03B 5/1246; H03B 5/125; H03B 5/1253; H03B 5/1262; H03B 5/1265
USPC .......... 331/36 C, 117 FE, 117 R, 167, 177 V
See application file for complete search history.

(56) References Cited

U.S. PATENT DOCUMENTS

| | | | |
|---|---|---|---|
| 4,503,401 A * | 3/1985 | Kyriakos et al. ................ 331/4 |
| 6,965,761 B2 * | 11/2005 | Welland et al. ............. 455/262 |
| 7,183,860 B2 | 2/2007 | Staszewski et al. | |
| 7,199,698 B1 * | 4/2007 | Goldfarb ................... 331/177 V |
| 7,323,944 B2 * | 1/2008 | Florescu et al. ............... 331/14 |
| 7,365,609 B2 | 4/2008 | Waheed et al. | |
| 7,417,512 B2 * | 8/2008 | Lee .............................. 331/158 |
| 7,439,817 B2 | 10/2008 | Waheed et al. | |
| 7,528,665 B2 * | 5/2009 | Coppola et al. ................. 331/2 |
| 7,626,470 B2 * | 12/2009 | Yu ............................ 331/117 R |

(Continued)

OTHER PUBLICATIONS 3.6 GHz highly monotonic digitally controlled oscillator for all-digital phase locked loop Microwave Symposium Digest (MTT), 2011 IEEE MTT-S International Date: Jun. 5-10, 2011.

(Continued)

*Primary Examiner* — Levi Gannon
(74) *Attorney, Agent, or Firm* — Baker Botts L.L.P.

(57) ABSTRACT

A circuit may include a digitally-controlled oscillator including a coarse frequency-tuning array with a multiple selectable coarse frequency-tuning segments. Each of the coarse frequency-tuning segments may have a coarse segment frequency step size. The digitally-controlled oscillator may also include a fine frequency-tuning array with multiple selectable fine frequency-tuning segments. The fine frequency-tuning array may have a fine array frequency step size that is at least twice the coarse segment frequency step size. The digitally-controlled oscillator may be configured to generate an output signal with a frequency based on the coarse frequency-tuning array and the fine frequency-tuning array.

9 Claims, 7 Drawing Sheets

(56) References Cited

U.S. PATENT DOCUMENTS

| | | | |
|---|---|---|---|
| 7,764,127 B2* | 7/2010 | Sun et al. | 331/36 C |
| 7,812,678 B2* | 10/2010 | Moussavi | 331/25 |
| 8,000,428 B2 | 8/2011 | Staszewski et al. | |
| 8,125,285 B2* | 2/2012 | Titus | 331/177 V |
| 8,138,845 B1* | 3/2012 | Zhang et al. | 331/117 FE |
| 8,169,270 B2* | 5/2012 | Zeng et al. | 331/179 |
| 8,198,944 B2 | 6/2012 | Sun et al. | |
| 2009/0302958 A1* | 12/2009 | Sakurai et al. | 331/1 A |
| 2009/0309666 A1* | 12/2009 | Sun et al. | 331/44 |
| 2010/0052795 A1* | 3/2010 | Nakamura et al. | 331/10 |
| 2010/0265001 A1* | 10/2010 | Tsuda et al. | 331/36 C |

OTHER PUBLICATIONS

Fine and wide frequency tuning digital controlled oscillators utilizing capacitance position sensitivity in distributed resonators Solid-State Circuits Conference, 2007. ASSCC '07. IEEE Asian.

A First Multigigahertz Digitally Controlled Oscillator for Wireless Applications Microwave Theory and Techniques, IEEE Transactions on vol. 51 Issue: 11 pp. 2154-2164, 2003.

* cited by examiner

ADJUSTING TUNING SEGMENTS IN A DIGITALLY-CONTROLLED OSCILLATOR

FIELD

The embodiments discussed herein are related to tuning a digitally-controlled oscillator.

BACKGROUND

A digitally-controlled oscillator (DCO) is an electronic circuit for synthesizing a range of frequencies from a fixed reference clock. The nominal output frequency generated by a DCO is a function of the value of a digital control code. DCOs may be used as frequency synthesizers for a variety of electronic circuit-based applications. DCOs are being increasingly employed, for example, in the arenas of wireless communications, mobile digital video broadcasting, fixed cable and satellite TV tuners, digital signal processing, and a host of other radio frequency and system on-chip circuit designs.

DCO-produced waveforms may be used to implement functions such as clock and data recovery, carrier wave synthesis, signal encoding/decoding and modulation/demodulation, programmable waveform generation, and the like. Many recent applications involving wireless communications have seen the widespread use of DCOs implemented within digital phase-locked loops (DPLLs) for a radio frequency (RF) local-oscillator (LO). Due to its digital nature, the DCO can offer fast switching between output frequencies, fine frequency setting resolution, and operation over a broad frequency range. DCOs may also offer superior noise rejection over conventional circuit techniques by reducing the number of analog circuit components, and reducing or eliminating noise susceptible parameters such as oscillator control voltages.

The subject matter claimed herein is not limited to embodiments that solve any disadvantages or that operate only in environments such as those described above. Rather, this background is only provided to illustrate one example technology area where some embodiments described herein may be practiced.

SUMMARY

According to an aspect of an embodiment, a circuit may include a digitally-controlled oscillator (DCO) including a coarse frequency-tuning array with multiple selectable coarse frequency-tuning segments. Each of the coarse frequency-tuning segments may have a coarse segment frequency step size. The DCO may also include a fine frequency-tuning array with multiple selectable fine frequency-tuning segments. The fine frequency-tuning array may have a fine array frequency step size that is at least twice the coarse segment frequency step size. The DCO may be configured to generate an output signal with a frequency based on the coarse frequency-tuning array and the fine frequency-tuning array.

The object and advantages of the embodiments will be realized and achieved at least by the elements, features, and combinations particularly pointed out in the claims.

It is to be understood that both the foregoing general description and the following detailed description are exemplary and explanatory and are not restrictive of the invention, as claimed.

BRIEF DESCRIPTION OF THE DRAWINGS

Example embodiments will be described and explained with additional specificity and detail through the use of the accompanying drawings in which.

DESCRIPTION OF EMBODIMENTS

According to an aspect of an embodiment, a circuit is described that includes a digitally-controlled oscillator (DCO) that includes multiple digitally-addressed tuning arrays that each includes multiple segments. The DCO is configured to generate an output signal at a frequency that is based on the segments selected from each of the tuning arrays. To change the frequency of the output signal, the segments selected from one or more of the tuning arrays may be changed.

The tuning arrays may have a hierarchical frequency resolution progressing from a more coarse resolution to a more fine resolution. One or more pairs of directly adjacent tuning arrays in the DCO may be configured so that there are at least two combinations of segments that may be selected for nearly the same output signal frequencies that may be generated by the pair of tuning arrays. For example, the selection of a first segment in a first tuning array and a second segment in a second tuning array may result in an output signal with a frequency and the selection of another segment in the first tuning array and another segment in the second tuning array may result in the output signal at the same frequency.

By providing pairs of tuning arrays that may generate a single or similar frequencies from multiple combinations of segments, the DCO may be able to smoothly switch between the different combinations of segments while reducing or eliminating disruptions to an output signal being generated by the DCO. The ability to switch between segments with reduced or eliminated disruptions to the output signal may expand the number of different output signals with different frequencies that may be generated by the DCO before the DCO is recalibrated. Expanding the number of different output signals with different frequencies that may be generated without recalibrating the DCO may increase the ability of the DCO to adapt to changing conditions of a circuit that includes the DCO including changes in temperature, supply voltages and/or currents, and/or loads, among other circuit conditions.

Embodiments of the present invention will be explained with reference to the accompanying drawings.

Figure 1:
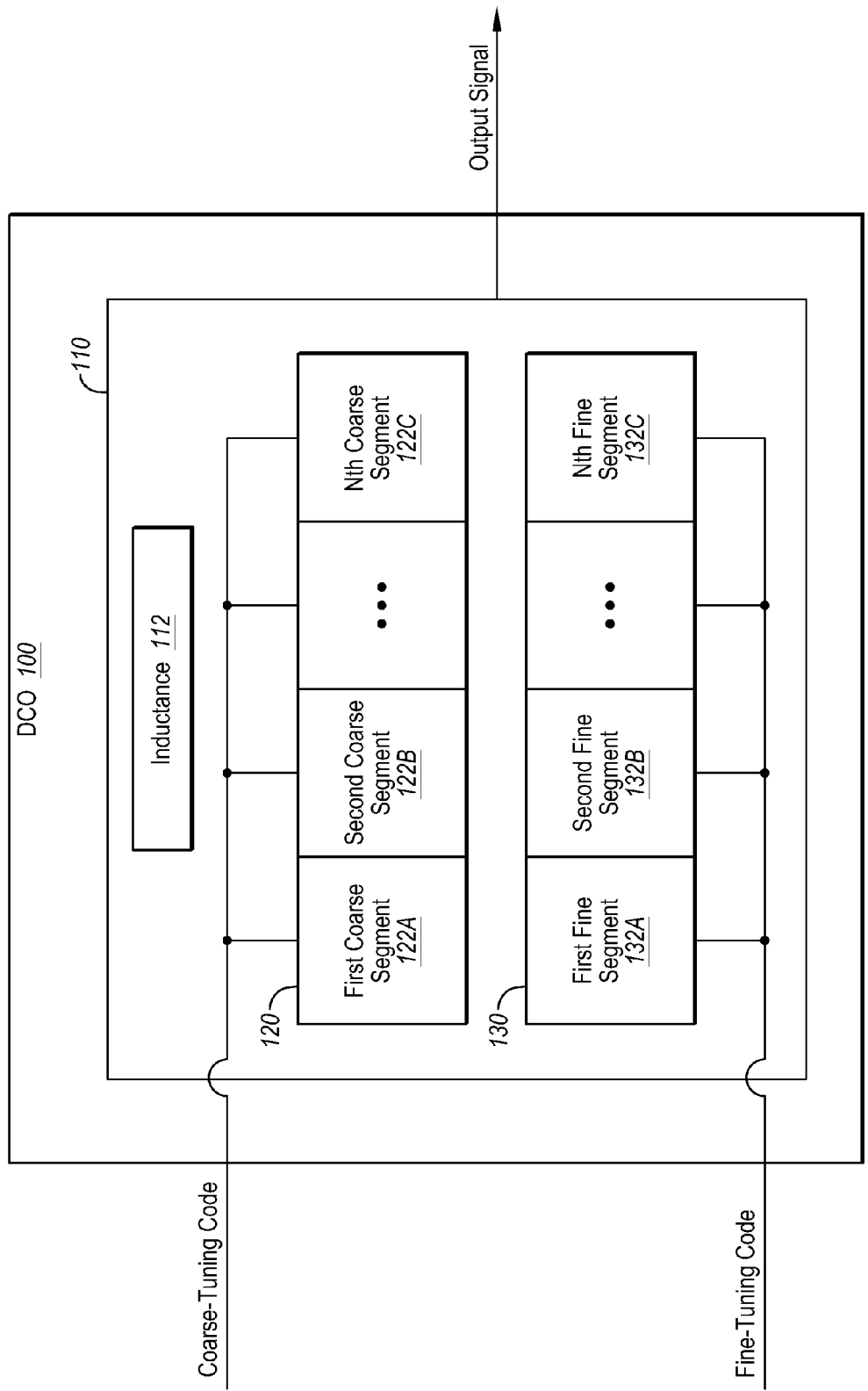
FIG. 1 is a block diagram of an example digitally-controlled oscillator (DCO)

FIG. 1 is a block diagram of an example DCO 100, arranged in accordance with at least some embodiments described herein. The DCO 100 may include an inductor-capacitor (LC) resonant circuit 110 that includes an inductance 112, a coarse frequency-tuning array 120, and a fine frequency-tuning array 130.

The coarse frequency-tuning array 120 may include multiple coarse segments 122, illustrated as first, second, and nth coarse segments 122A, 122B, and 122C. Each of the coarse segments 122 may have a capacitance. In some embodiments, the capacitance of the coarse segments 122 may be approximately equal. Each of the coarse segments 122 may be configured to be switched into the LC resonant circuit 110 by the DCO 100 based on a received coarse-tuning code. When the coarse segments 122 are switched into the LC resonant circuit 110, the capacitance of the coarse segments 122 switched into the LC resonant circuit 110 is seen by and affects the LC resonant circuit 110. For example, when the first and second coarse segments 122A and 122B are switched into the LC resonant circuit 110, the combined capacitance of the first and second coarse segments 122A and 122B is seen by and affects the LC resonant circuit 110.

The fine frequency-tuning array 130 may include multiple fine segments 132, illustrated as first, second, and nth fine segments 132A, 132B, and 132C. Each of the fine segments 132 may have a capacitance. In some embodiments, the capacitance of the fine segments 132 may be approximately equal. The capacitance of each of the fine segments 132 may be less than the capacitance of each of the coarse segments 122.

Each of the fine segments 132 may be configured to be switched into the LC resonant circuit 110 by the DCO 100 based on a fine-tuning code received by the DCO 100. When the fine segments 132 are switched into the LC resonant circuit 110, the capacitance of the fine segments 132 switched into the LC resonant circuit 110 is seen by and affects the LC resonant circuit 110. For example, when the first and second fine segments 132A and 132B are switched into the LC resonant circuit 110, the combined capacitance of the first and second fine segments 132A and 132B is seen by and affects the LC resonant circuit 110.

The DCO 100, using the LC resonant circuit 110, may be configured to generate an output signal at a frequency based on the inductance 112, the capacitance of the coarse and fine frequency-tuning arrays 120 and 130 switched into the LC resonant circuit 110, among other parasitic capacitance or other capacitance in the LC resonant circuit 110 and/or the DCO 100. The frequency of the output signal may be adjusted by changing the capacitance of the coarse and fine frequency-tuning arrays 120 and 130 switched into the LC resonant circuit 110 or changing the inductance 112. For example, the frequency of the output signal may be increased by reducing the capacitance of the coarse and fine frequency-tuning arrays 120 and 130 switched into the LC resonant circuit 110 and the frequency of the output signal may be decreased by increasing the capacitance of the coarse and fine frequency-tuning arrays 120 and 130 switched into the LC resonant circuit 110.

As noted, the DCO 100 may adjust the capacitance of the coarse and fine frequency-tuning arrays 120 and 130 switched into the LC resonant circuit 110 based on the coarse-tuning code and the fine-tuning code, respectively. For example, the DCO 100 may adjust the capacitance of the coarse frequency-tuning array 120 by switching a number of coarse segments 122 into or out of the LC resonant circuit 110 in accordance with the coarse-tuning code. In some embodiments, the coarse-tuning code may indicate a number of coarse segments 122 to have switched into the LC resonant circuit 110. In these and other embodiments, the DCO 100 may switch additional coarse segments 122 into the LC resonant circuit 110 or switch out coarse segments 122 currently switched in the LC resonant circuit 110. Alternately or additionally, the coarse-tuning code may indicate the specific coarse segments 122 to switch into or out of the LC resonant circuit 110.

In some embodiments, the DCO 100 may switch the coarse segments 122 into or out of the LC resonant circuit 110 based on the coarse-tuning code using a binary coding scheme. In these and other embodiments, each bit in the coarse-tuning code may indicate a different amount of capacitance, and thus a different number of coarse segments 122 to have switched into the LC resonant circuit 110. Based on the coarse-tuning code and the alignment of the bits in the coarse-tuning code, multiple coarse segments may be switched into or out of the LC resonant circuit 110 at one time. Alternately or additionally, the DCO 100 may switch the coarse segments 122 into or out of the LC resonant circuit 110 based on the coarse-tuning code using thermometer coding. In these and other embodiments, the coarse segments 122 may be switched into or out of the LC resonant circuit 110 one at a time.

The DCO 100 may adjust the capacitance of the fine frequency-tuning array 130 by switching a number of fine segments 132 into or out of the LC resonant circuit 110 in accordance with the fine-tuning code in a similar manner as the DCO switches the coarse segments 122 into or out of the LC resonant circuit 110.

As discussed above, the frequency of the output signal may be adjusted based on a number of coarse segments 122 and fine segments 132 switched into the LC resonant circuit 110. The amount of frequency adjustment, e.g., a frequency step size, when a fine segment 132 is switched into or out of the LC resonant circuit 110 may be referred to as a fine segment frequency step size. In some embodiments, the fine segments 132 may each have similar frequency step sizes. Alternately or additionally, the frequency step sizes of the fine segments 132 may vary. The frequency step sizes, when all of the fine segments 132 are switched into or out of the LC resonant circuit 110, may be referred to as the frequency step size of the fine frequency-tuning array 130 or as a fine array frequency step size.

The amount of frequency adjustment when a coarse segment 122 is switched into or out of the LC resonant circuit 110 may be referred to as a coarse segment frequency step size. In some embodiments, the coarse segments 122 may each have similar frequency step sizes. Alternately or additionally, the frequency step sizes of the coarse segments 122 may vary. The frequency step sizes, when all of the coarse segments 122 are switched into or out of the LC resonant circuit 110, may be referred to as the frequency step size of the coarse frequency-tuning array 120 or as a coarse array frequency step size.

The frequency step sizes of the fine segments 132 may be smaller than the frequency step sizes of the coarse segments 122. As a result, the coarse segments 122 may provide coarse resolution for tuning the DCO 100 and the fine segments 132 may provide fine resolution for tuning the DCO 100. To generate an output signal of a desired frequency, the DCO 100 may switch into or out of the LC resonant circuit 110 one or more coarse segments 122 so that a frequency step size of the coarse segments 122 includes the desired frequency of the output signal. The DCO 100 may then switch into or out of the LC resonant circuit 110 one or more fine segments 132 to bring the output signal to the desired frequency.

For example, assume that frequency step size of a coarse segment 122 is 1 megahertz (MHz) and the frequency step size of a fine segment 132 is 50 kilohertz (KHz). Assume also that the desired frequency of the output signal is 4.3 MHz. In these and other embodiments, the DCO 100 may switch into or out of the LC resonant circuit 110 a number of coarse segments 122 until the coarse segments 122 provide for output signals with frequencies from 4 to 5 MHz. The DCO 100 may also switch into or out of the LC resonant circuit 110 a number of fine segments 132 until the desired frequency of the output signal of 4.3 MHz is reached. For example, assume that with all the fine segments 132 switched into the LC resonant circuit 110 and a number of coarse segments 122, the frequency of the output signal is 4 MHz, the DCO 100 may switch out six fine segments 132 to reduce the capacitance of the LC resonant circuit 110 and raise the frequency of the output signal to 4.3 MHz (the frequency is raised by 300 KHz which equals the aggregate frequency step size (50 KHz) of six fine segments 132).

In a typical DCO, the frequency step size of a coarse segment is marginally smaller or equal to the frequency step size of a fine frequency-tuning array and thus the frequency step size of all of the fine segments in the fine frequency-tuning array combined. This allows the fine segments to provide finer resolution control throughout the entire frequency step size of the coarse segment. Having the frequency step size of the fine frequency-tuning array bigger than the frequency step size of the coarse segment may be referred to as overlap. For example, the overlap of the frequency step size of the fine frequency-tuning array may be 5, 15, or 20 percent. As a result, for the majority of frequencies of the output signal, the DCO may have a single combination of coarse and fine segments that may be used to achieve the frequencies of output signals generated by the DCO.

In the present disclosure, the overlap of the frequency step size of the fine frequency-tuning array 130 may be at least one hundred percent. As a result, the fine array frequency step size may be approximately twice the frequency step size of one of the coarse segments 122. The frequency step size of one of the coarse segments 122 may be referred to as a coarse segment frequency step size. Thus, the combined frequency step size of half of the fine segments 132 may be approximately equal to or greater than a frequency step size of one of the coarse segments 122. As a result of the at least one hundred percent overlap, a desired frequency of an output signal for the majority of the frequencies generated by the DCO 100 may be achieved with at least two if not multiple combinations of coarse and fine segments 122, 132. For example, in some embodiments, for frequencies near the edge of the range of the DCO 100, multiple combinations of coarse and fine segments 122, 132 may not be available to generate these frequencies. Outside of the frequencies near the edges of the range of the DCO 100, multiple combinations of coarse and fine segments 122, 132 may be available. Put another way, the DCO 100 may achieve a similar level of capacitance within the LC resonant circuit 110 for the majority of capacitance levels using at least two different combinations of the coarse segments 122 and the fine segments 132.

For example, assume that the DCO 100 includes thirty-two fine segments 132 and eight coarse segments 122. An output signal with a first frequency may be generated by the DCO 100 when four of the coarse segments 122 and eight of the fine segments 132 are selected. In addition, the output signal with the first frequency may be generated by the DCO 100 when three of the coarse segments 122 and twenty-four of the fine segments 132 are selected.

With a frequency of the output signal being able to be generated using at least two different combinations of the coarse segments 122 and the fine segments 132, the DCO 100 may switch between the different combinations of the coarse segments 122 and the fine segments 132 while the DCO 100 continues to generate the output signal at the frequency without significantly disturbing the frequency of the output signal. In other words, the DCO 100 may switch between the coarse segments 122 and/or the fine segments 132 and maintains the same or approximately the same output frequency without having to recalibrate. Recalibration as used herein may refer to adjusting the coarse segments 122 and the fine segments 132 until a desired frequency of the output signal is obtained. For example, recalibration of the DCO 100 may occur when the DCO 100 is part of a phase-locked loop (PLL) and the PLL is locking the output signal to a reference signal. Recalibration is further described with respect to FIG. 4. The switch may occur without recalibration because switching between the different combinations results in the LC resonant circuit 110 seeing the same or approximately the same amount of total capacitance even though the capacitance is supplied by a different combination of the coarse and/or the fine segments 122 and 132.

The ability to switch to different coarse segments 122 and/or different fine segments 132 while continuing to generate the output signal at the same or approximately the same frequency or without recalibrating may extend the range of frequencies over which the DCO 100 may operate without recalibration. Extending the range of frequencies over which the DCO 100 may operate without recalibration may allow the DCO 100 to better adapt to changes in a circuit in which the DCO 100 operates, such as load changes, temperature changes, voltage changes, among other changes.

Modifications, additions, or omissions may be made to the DCO 100 without departing from the scope of the present disclosure. For example, the DCO 100 may include one or more decoders. In these and other embodiments, the coarse-tuning code and the fine-tuning code may each be configured as addresses and each received on a set of address lines. The one or more decoders may be configured to decode the coarse and fine-tuning codes. The DCO 100 may use the decoded coarse and fine-tuning codes to switch coarse and fine segments 122 and 132 into or out of the LC resonant circuit 110. In some embodiments, the frequency of the output signal may be adjusted by adjusting the inductance in the LC resonant circuit 110. In these and other embodiments, the coarse frequency-tuning array 120 and the fine frequency-tuning array 130 may be related to inductance and adjusting the coarse frequency-tuning array 120 and the fine frequency-tuning array 130 may adjust the inductance of the LC resonant circuit 110.

It should further be understood that the fine segments 132 may not have identical capacitances due to manufacturing limitations. Alternately or additionally, the coarse segments 122 may not have identical capacitances due to manufacturing limitations. Accordingly, different combination of fine segments 132 and coarse segments 122 may have very similar capacitances, but not identical capacitances. As a result, the frequencies generated by the different combinations of fine and coarse segments 132 and 122 may not be identical, but may be approximately the same. References herein to frequencies being the same may include frequencies being approximately equal but not identical due to capacitance variability between the fine segments 132, the coarse segments 122, and the capacitance of the LC resonant circuit 110 when different fine and coarse segments 132 and 122 are switched into the LC resonant circuit 110.

Figure 2:
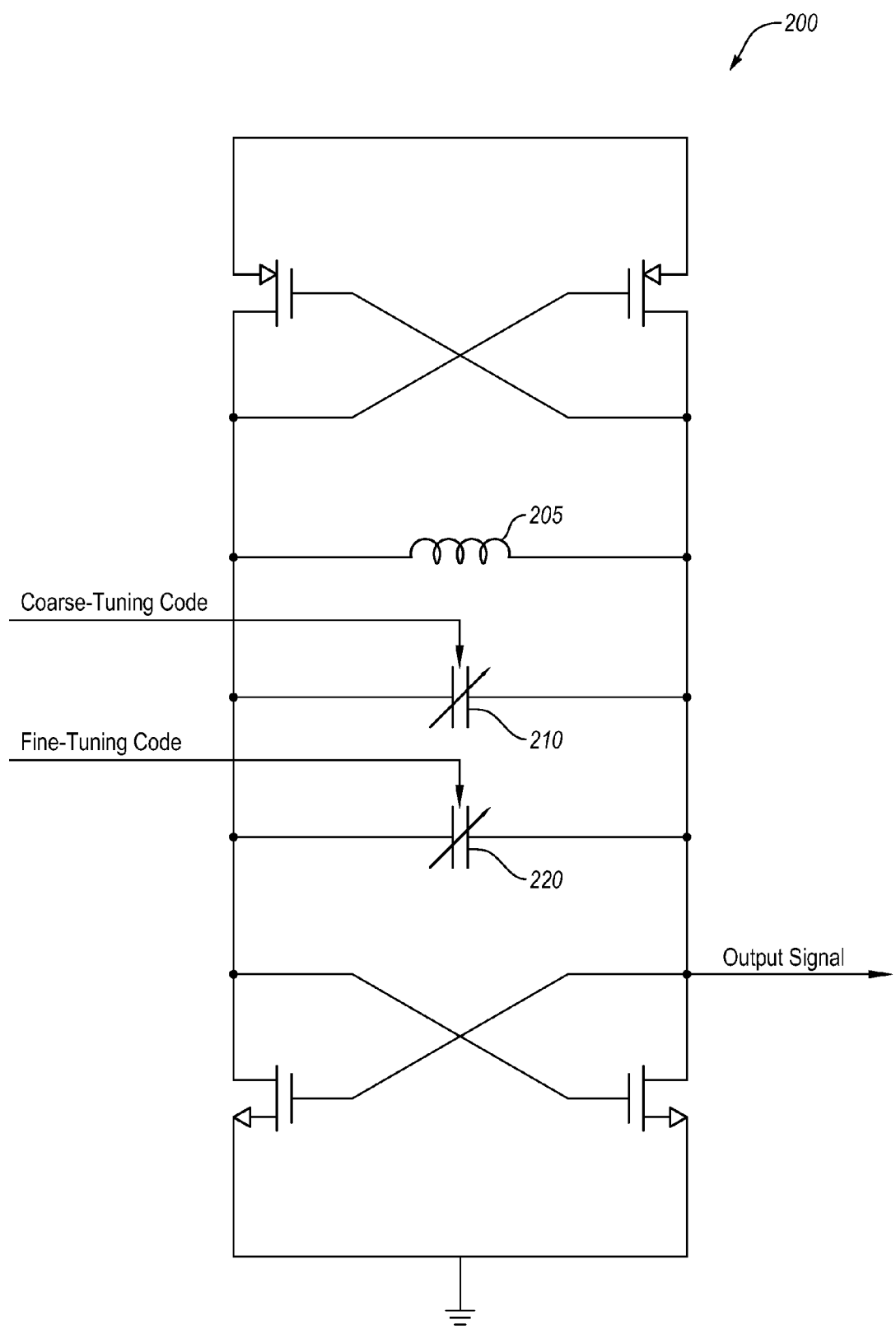
FIG. 2 is a circuit diagram of an example DCO LC resonant circuit.

FIG. 2 is a circuit diagram of an example DCO LC resonant circuit 200, arranged in accordance with at least some embodiments described herein. The DCO LC resonant circuit 200 includes an inductance 205 arranged in parallel with a coarse frequency-tuning array 210 and a fine frequency-tuning array 220. The coarse frequency-tuning array 210 and the fine frequency-tuning array 220 are also arranged in parallel with respect to each other. The DCO LC resonant circuit 200 further includes an active stage consisting of various transistors. Modifications, additions, or omissions may be made to the DCO LC resonant circuit 200 without departing from the scope of the present disclosure.

Figure 3:
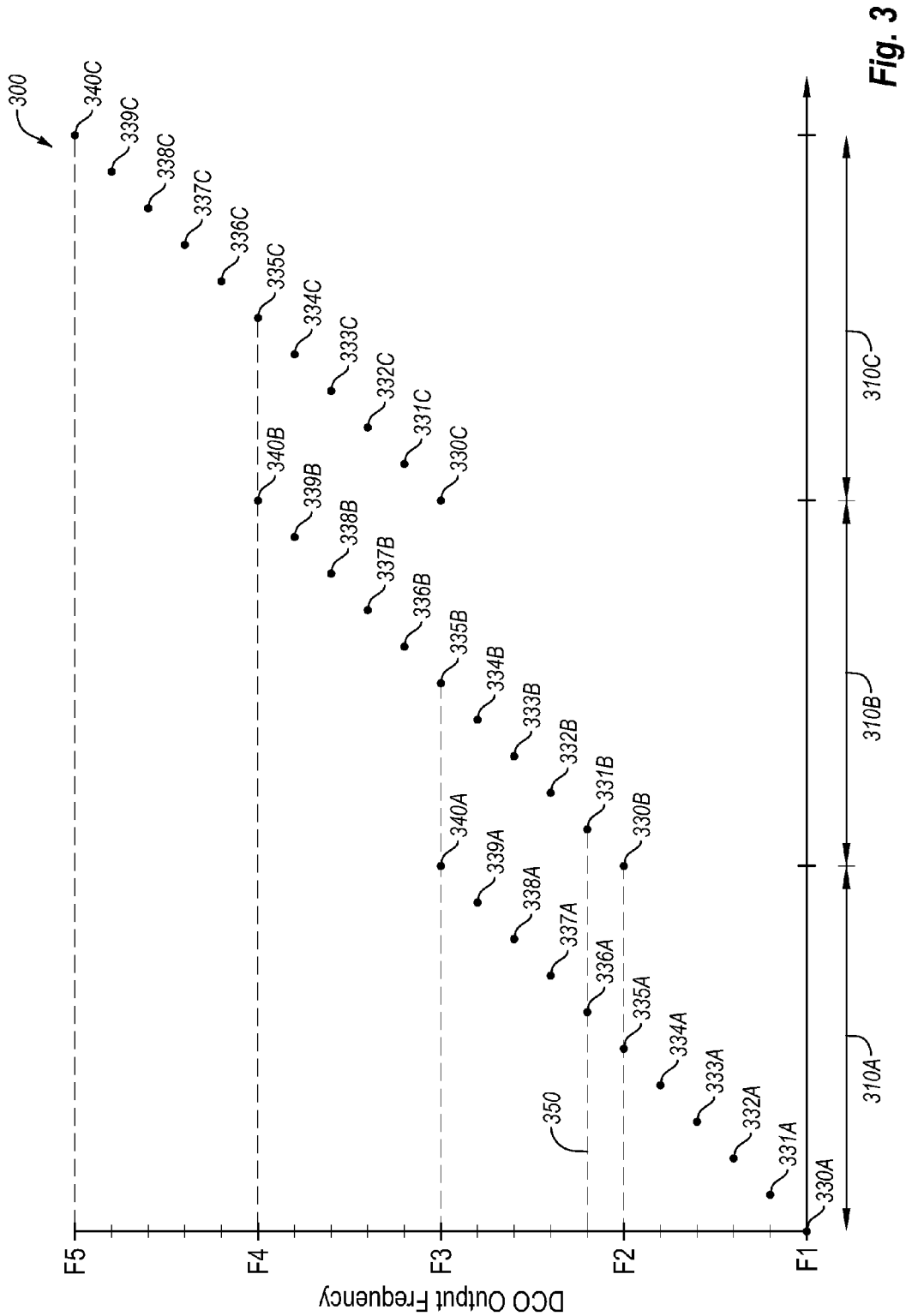
FIG. 3 is a graph illustrating frequencies of output signals that may be generated by the DCO of FIG. 1.

FIG. 3 is a graph 300 illustrating frequencies of output signals that may be generated by the DCO 100 of FIG. 1, arranged in accordance with at least some embodiments described herein. The graph 300 illustrates first, second, and third coarse states 310A, 310B, 310C, referred to collectively as the coarse states 310. The coarse states 310 may be selected by adjusting a number of coarse segments 122 that are switched into or out of the LC resonant circuit 110. The graph 300 further illustrates eleven fine states 330-340. The fine states 330-340 may be selected by adjusting a number of fine segments 132 that are switched into or out of the LC resonant circuit 110. The fine states 330-340 may be selected when the first coarse state 310A, the second coarse state 310B, or the third coarse state 310C is selected. When the first coarse state 310A is selected, the fine states 330-340 may be referenced as fine state 330A-340A. When the second coarse state 310B is selected, the fine states 330-340 may be referenced as fine states 330B-340B. When the third coarse state 310C is selected, the fine states 330-340 may be referenced as fine states 330C-340C.

The graph 300 further illustrates frequencies of the output signal based on the selection of the coarse states 310 and the fine states 330-340. In the graph 300, the combined frequency step size of the fine states 330-340, (e.g., the fine array frequency step size) is equal to twice the coarse segment frequency step size. For example, the coarse segment frequency step size may allow for stepping between frequencies F1, F2, F3, F4, and F5 in the graph 300. The fine array frequency step size may allow for stepping between frequency ranges that are twice the frequency ranges between F1 and F2, F2 and F3, and F3 and F4, etc. For example, the fine array frequency step size may allow for stepping between frequencies F1 and F3, F2 and F4, and F3 and F5.

Because the fine array frequency step size equals twice the coarse segment frequency step size, there is one hundred percent overlap by the fine states 330-340 for at least one of the coarse states 310, e.g., the second coarse state 310B. Furthermore, because of the one hundred percent overlap by the fine states 330-340, every frequency that may be generated by the DCO 100 may be generated using two different combinations of the coarse states 310 and the fine states 330-340. The graph 300 illustrates the one hundred percent overlap of the fine states 330-340 with respect to the second coarse state 310B. Each of the frequencies that may be generated using the second coarse state 310B and the fine states 330B-340B may also be generated using either the first coarse state 310A and some of the fine states 330A-340A or the third coarse state 310C and some of the fine states 330C-340C.

For example, the frequencies generated by the second coarse state 310B and the fine states 330B-335B may be generated using the first coarse state 310A and the fine states 335A-340A. The frequencies generated by the second coarse state 310B and the fine states 335B-340B may be generated using the third coarse state 310C and the fine states 330C-335C.

Because at least some of the frequencies that may be generated by the DCO 100 may be generated using two different combinations of the coarse states 310 and the fine states 330-340, the DCO 100 may switch to a different coarse state and fine state without recalibration and thus while continually generating the output signal at a frequency. For example, the DCO 100 may be generating a frequency 350 based on the second coarse state 310B and the fine state 331B. The DCO may switch the coarse states 310 and the fine states 330-340 to the coarse state 310A and the fine state 336A and continue generating the frequency 350.

During operation of the DCO 100, the fine states 330-340 selected by the DCO 100 may change due to various operating conditions, such as changes in temperature, operating voltages, loads, among other changes. In a typical DCO, when a selected fine state is near the end of the range of the fine states and thus near an edge of a coarse state, the typical DCO may need to be recalibrated to avoid reaching the end of the range of the fine states and not being able to be further adjusted. During recalibration, the typical DCO may change the coarse state and search to locate the fine state that generates the same or approximately the same frequency of the output signal as the previous coarse state and fine state.

In the DCO 100, when the selected fine state is near the end of the range of the fine states (e.g., the selected fine state is fine state 330B or 340B) and thus near an edge of the coarse state, the DCO 100 may switch to another coarse state and fine state that generate the same frequency without being recalibrated as described. In some embodiments, the DCO 100 may know which fine state to select when switching coarse states based on a fine state exchange rate, referred to herein as an exchange rate, between coarse states. The exchange rate may be calculated before the DCO 100 switches between the coarse states.

To calculate an exchange rate, a first coarse state and a first fine state may be selected by the DCO 100 to generate an output signal at a first frequency. The first coarse state may be adjusted by one to a second coarse state and the DCO 100 may be recalibrated to determine a second fine state that generates the output signal at the first frequency. The number of fine states between the second fine state and the first fine state may be the exchange rate. For example, for the frequency 350, the DCO 100 may switch from the coarse state 310B and the fine state 331B to the coarse state 310A and the fine state 336A. The exchange rate in this example is five.

The exchange rate may be added or subtracted from a current fine state to determine the new fine state. The exchange rate is added or subtracted based on the location of the new coarse state in relation to the current coarse state. For example, when the new coarse state generates a higher frequency range than the current coarse state, the exchange rate may be subtracted from the current fine state. When the new coarse state generates a lower frequency range than the current coarse state, the exchange rate may be added to the current fine state. Whether the exchange rate is added to or subtracted from the current fine state may depend on the configuration of the coarse segments and the fine states.

In some embodiments, the exchange rate may be determined once for all the coarse states of the DCO 100. Alternately or additionally, the exchange rate for each of the fine states within each of the coarse states may be determined and used. Alternately or additionally, an exchange rate may be calculated for each adjacent pair of coarse states in the DCO 100 and/or for each fine state for each adjacent pair of coarse states. Alternately or additionally, a first exchange rate may be determined for coarse states near the lower frequency range of the DCO 100 and a second exchange rate may be determined for coarse states near the upper frequency range of the DCO 100. The first and second exchange rates may be determined separately due to a non-linear relationship between capacitance and a frequency of an output signal generated by the DCO 100. In some embodiments, the number of exchange rates that may be determined may depend on how uniform the capacitance is between the coarse segments and/or between the fine segments in the DCO 100.

As illustrated in FIG. 3, when going from the coarse state 310A to the coarse state 310B, the exchange rate, which is five as indicated above, is subtracted from the fine state 336A. The exchange rate subtracted from the fine state 336A results in the fine state 331B. When going from the coarse state 310B to the coarse state 310A, the exchange rate is added to the fine state 331B. The exchange rate added to the fine state 331B results in the fine state 336A.

The DCO 100 may determine to switch between coarse states based on thresholds. The thresholds may be based on how fast the DCO 100 is adjusting between fine states, operating parameters of the DCO 100, operating parameters of a circuit, such as a PLL, that include the DCO 100, among other parameters. In some embodiments, the DCO 100 may adjust when the DCO 100 has less than a particular percentage of fine states for adjusting in any direction within a coarse state. For example, when the selected fine state is in a first quartile or last quartile of the fine states, the DCO 100 may switch coarse states. For example, when the DCO 100 adjusts to be within two fine states 330-340 of the end of a coarse state 310, the DCO 100 may adjust from one coarse state 310 to another coarse state 310.

The graph 300 illustrates the DCO 100 having three coarse states 310 and eleven fine states 330-340. These numbers are examples only and the present disclosure should not be limited hereto. The DCO 100 may include a large range of coarse states and fine states. In some embodiments, the DCO 100 may include more coarse states than fine states. Alternately or additionally, the DCO 100 may include more fine states than coarse states. For example, the DCO 100 may include between ten and one hundred coarse states and between twenty and two hundred fine states.

Figure 4:
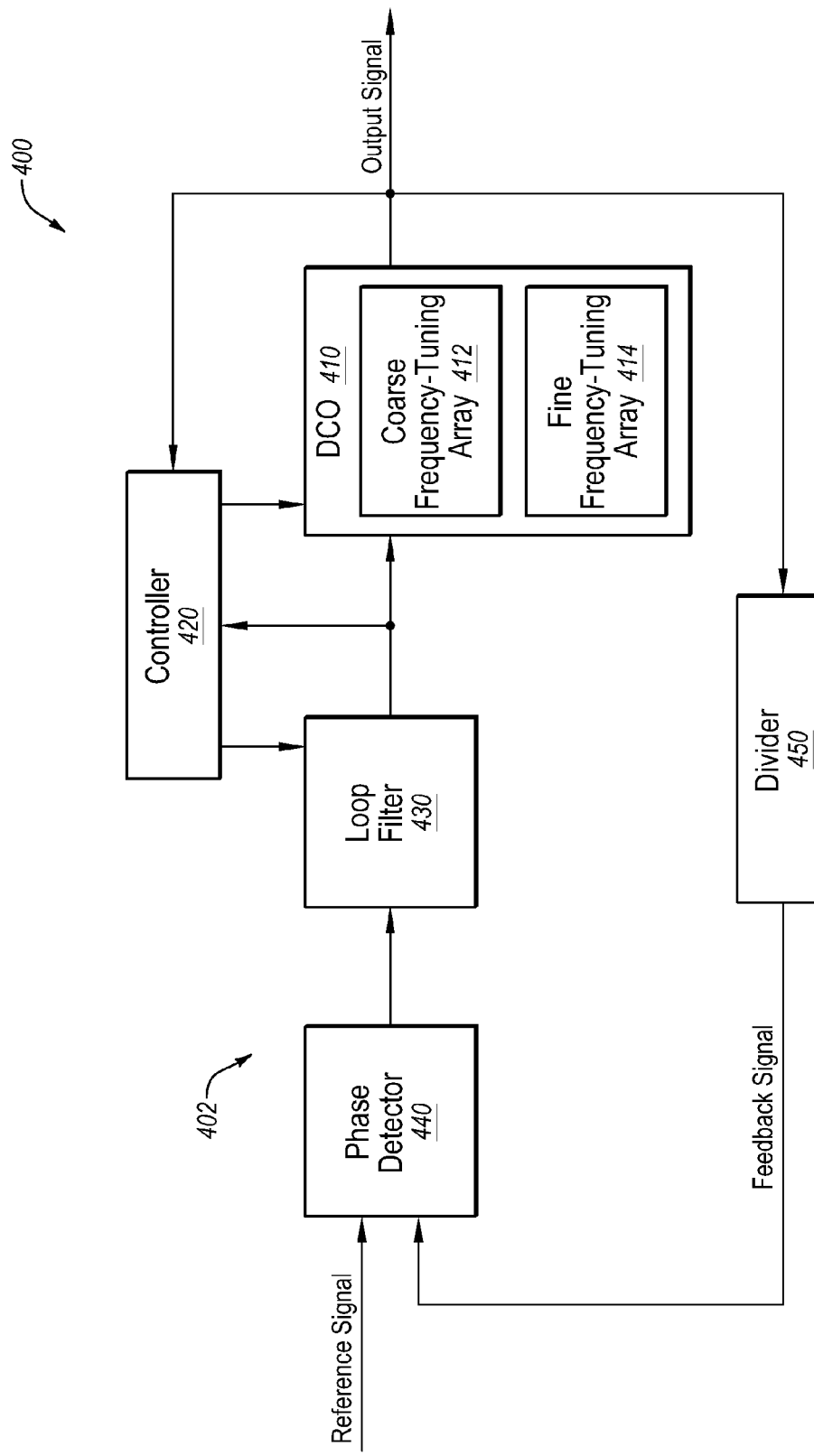
FIG. 4 is a block diagram of an example circuit that includes a DCO.

FIG. 4 is a block diagram of an example circuit 400 that includes a DCO 410, arranged in accordance with at least some embodiments described herein. The circuit 400 may also include a loop filter 430, a phase detector 440, and a divider 450, which along with the DCO 410 form a digital PLL 402. The DCO 410 may be analogous to and/or may include the DCO 100 described with respect to FIG. 1.

The DCO 410 may include a coarse frequency-tuning array 412 and a fine frequency-tuning array 414. The coarse frequency-tuning array 412 may include coarse segments that may be switched into or out of an LC resonant circuit within the DCO 410 based on a coarse-tuning code received from the controller 420. The fine frequency-tuning array 414 may include fine segments that may be switched into or out of an LC resonant circuit within the DCO 410 based on a fine-tuning code received from the loop filter 430. The DCO 410 may be configured to generate a frequency of an output signal based on the coarse segments and the fine segments switched into the LC resonant circuit. As a result, the frequency of the output signal may be based on the coarse-tuning code and/or the fine-tuning code.

The divider 450 may be coupled to the DCO 410 and the phase detector 440 and may be configured to divide the output signal by a divisor to generate a feedback signal that is sent to the phase detector 440. In some embodiments, the divider 450 may be a fractional-N divider. The phase detector 440 may be coupled to the divider 450 and the loop filter 430 and may be configured to compare the phase of the feedback signal and a reference signal. Based on a difference between the phase of the feedback signal and the reference signal, the phase detector 440 may generate and output a phase difference signal. The loop filter 430 may be coupled to the phase detector 440 and the DCO 410 and may be configured to filter the phase difference signal from the phase detector 440 to generate a fine-tuning signal. The loop filter 430 may provide the fine-tuning signal to the DCO 410.

The controller 420 may be coupled to the loop filter 430 and the DCO 410. The controller 420 may be configured to provide the coarse-tuning code to the DCO 410. The controller 420 may further be configured to calculate the exchange rates for the fine-tuning states that may be used when switching between coarse-tuning states.

To calculate an exchange rate, the controller 420 may provide a first coarse-tuning code to the DCO 410 based on the frequency of the reference signal and the divisor of the divider 450 that allows the DCO 410 to generate an output signal with a frequency divided by the divisor that matches the frequency of the reference signal. In some embodiments, the controller 420 may provide an initial fine-tuning code to the loop filter 430 for providing to the DCO 410. The PLL 402 may operate to adjust the fine-tuning code until the output signal has a frequency and phase that, divided by the divisor, matches the frequency and phase of the reference signal. The controller 420 may note the fine-tuning code being provided to the DCO 410 after the frequency and phase of the output signal that is divided by the divisor matches the frequency and phase of the reference signal. The PLL 402, operating to adjust the fine-tuning code until the frequency and phase of the output signal that is divided by the divisor matches the frequency and phase of the reference signal, may be referred to as calibrating the PLL 402 or DCO 410.

After the DCO 410 has a fine-tuning code that causes the frequency and phase of the output signal that is divided by the divisor to match the frequency and phase of the reference signal, the controller 420 may adjust the coarse-tuning code by incrementing or decrementing the coarse-tuning code. In some embodiments, the coarse-tuning code may be incremented or decremented based on the value of the fine-tuning code. The PLL 402 may operate to cause the loop filter 430 to adjust the fine-tuning code until a new fine-tuning code is determined that causes the frequency and phase of the output signal that is divided by the divisor to match the frequency and phase of the reference signal. The new fine-tuning code may be compared with the previous fine-tuning code to calculate the exchange rate.

After the exchange rate is calculated, when the coarse-tuning code is adjusted, the fine-tuning code may be adjusted based on the exchange rate to allow the DCO 410 to maintain the output signal with the same or approximately the same frequency without recalibration. For example, in some embodiments, the controller 420 may detect that the frequency of the output signal is near an edge of a selected coarse-tuning state. The controller 420 may determine a new coarse-tuning code, and using the exchange rate associated with the change between the previous coarse-tuning code and the new coarse-tuning code, may determine a new fine-tuning code based on the previous fine-tuning code. Between clock edges that operate the PLL 402, the controller 420 may send the new coarse-tuning code to the DCO 410 and cause the DCO 410 to select a new coarse-tuning state using the coarse frequency-tuning array 412. Between the same clock edges, the controller 420 may also send the new fine-tuning code to the loop filter 430 so that the loop filter 430 outputs the new fine-tuning code causing the DCO 410 to select a new fine-tuning state using the fine frequency-tuning array 414. Thus, upon the next clock edge, the DCO 410 has an equivalent tank capacitance that the DCO 410 had on the last clock edge. Because the DCO 410 has an equivalent tank capacitance, the disturbance of the output signal may be minimized or eliminated when switching between coarse and fine-tuning states. The ability to switch between coarse and fine-tuning states without recalibrating allows for the range of frequencies generated by the PLL 402 to be increased thereby increasing the ability of the PLL 402 to adapt to changes in the circuit 400 and the PLL 402. Modifications, additions, or omissions may be made to the circuit 400 without departing from the scope of the present disclosure.

Figure 5:
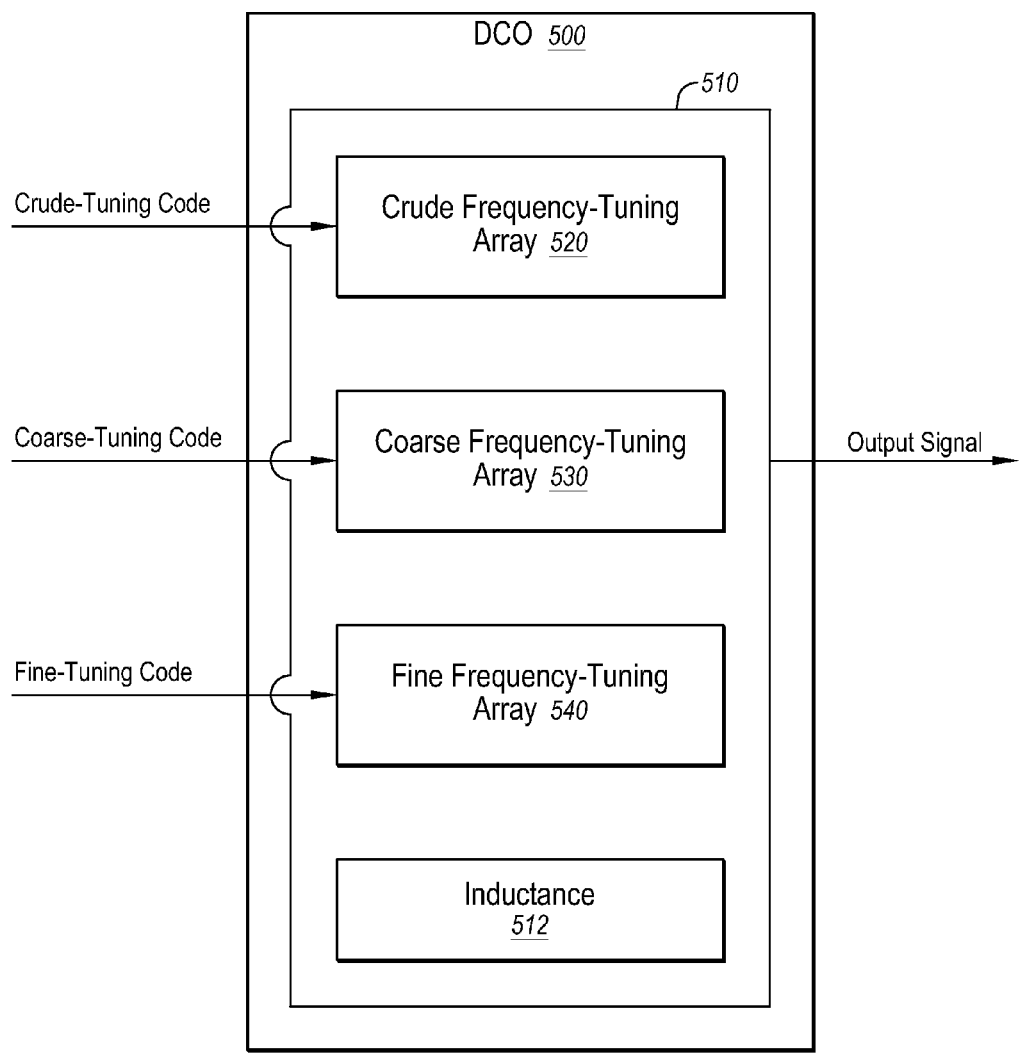
FIG. 5 is a block diagram of another example DCO.

FIG. 5 is a block diagram of another example DCO 500, arranged in accordance with at least some embodiments described herein. The DCO 500 may include an inductor-capacitor circuit (LC) resonant circuit 510 that includes an inductance 512, a crude frequency-tuning array 520, a coarse frequency-tuning array 530, and a fine frequency-tuning array 540.

The crude frequency-tuning array 520 may include multiple crude segments that each have a capacitance. Each of the crude segments may be configured to be switched into the LC resonant circuit 510 by the DCO 500 based on a received crude-tuning code. When the crude segments are switched into the LC resonant circuit 510, the capacitance of the crude segments switched into the LC resonant circuit 510 is seen by and affects the LC resonant circuit 510.

The coarse frequency-tuning array 530 may include multiple coarse segments that each have a capacitance. The capacitance of each of the coarse segments may be less than the capacitance of each of the crude segments. Each of the coarse segments may be configured to be switched into the LC resonant circuit 510 by the DCO 500 based on a received coarse-tuning code. When the coarse segments are switched into the LC resonant circuit 510, the capacitance of the coarse segments switched into the LC resonant circuit 510 is seen by and affects the LC resonant circuit 510.

The fine frequency-tuning array 540 may include multiple fine segments that each have a capacitance. The capacitance of each of the fine segments may be less than the capacitance of each of the coarse segments. Each of the fine segments may be configured to be switched into the LC resonant circuit 510 by the DCO 500 based on a fine-tuning code received by the DCO 530. When the fine segments are switched into the LC resonant circuit 510, the capacitance of the fine segments switched into the LC resonant circuit 510 is seen by and affects the LC resonant circuit 510.

The DCO 500, using the LC resonant circuit 510, may be configured to generate an output signal at a frequency based on the inductance 512, and the capacitance of the crude, coarse, and fine frequency-tuning arrays 520, 530, and 540 switched into the LC resonant circuit 510, among other parasitic capacitance or other capacitance in the LC resonant circuit 510. The frequency of the output signal may be adjusted by changing the capacitance of the crude, coarse, and/or fine frequency-tuning arrays 520, 530, and 540 switched into the LC resonant circuit 510.

The amount of frequency adjustment, e.g., a frequency step size, when a fine segment is switched into or out of the LC resonant circuit 510 may be referred to as a fine segment frequency step size. The frequency step size when all of the fine segments are switched into or out of the LC resonant circuit 510 may be referred to as the frequency step size of the fine frequency-tuning array 540.

The amount of frequency adjustment when a coarse segment is switched into or out of the LC resonant circuit 510 may be referred to as a coarse segment frequency step size. The frequency step size when all of the coarse segments are switched into or out of the LC resonant circuit 510 may be referred to as the frequency step size of the coarse frequency-tuning array 530. The amount of frequency adjustment, e.g., a frequency step size, when a crude segment is switched into or out of the LC resonant circuit 510 may be referred to as a crude segment frequency step size.

The fine segment frequency step size may be smaller than the coarse segment frequency step size and the coarse segment frequency step size may be smaller than the crude segment frequency step size. As a result, a crude segment may provide crude resolution for tuning the DCO 500, a coarse segment may provide coarse resolution for tuning the DCO 500, and a fine segment may provide fine resolution for tuning the DCO 500.

The overlap of the frequency step size of the fine frequency-tuning array 540 with respect to the coarse segment frequency step size may be at least one hundred percent. As a result, the frequency step size of the fine frequency-tuning array 540 may be at least approximately twice the coarse segment frequency step size. Alternately or additionally, the overlap of the frequency step size of the coarse frequency-tuning array 530 with respect to a crude segment may be at least one hundred percent. As a result, the frequency step size of the coarse frequency-tuning array 530 may be at least approximately twice the crude segment frequency step size.

As a result, a frequency or a similar frequency of the output signal may be able to be generated using at least two different combinations of crude segments, coarse segments, and fine segments. Thus, the DCO 500 may switch between the different combinations of the crude, coarse, and fine segments while the DCO 500 continues to generate the output signal at the frequency without significantly disturbing the frequency of the output signal. In other words, the DCO 500 may switch between crude, coarse, and fine segments without having to recalibrate.

In these and other embodiments, to enable the DCO 500 to switch between crude, coarse, and fine segments without having to recalibrate, fine exchange rates may be calculated for the fine frequency-tuning array 540 with respect to changes in the coarse frequency-tuning array 530 and coarse exchange rates may also be calculated for the coarse frequency-tuning array 530 with respect to changes in the crude frequency-tuning array 520.

Because of the one hundred percent overlap of the fine frequency-tuning array 540 with respect to a coarse segment, the DCO 510 may switch between adjacent coarse segments without recalibration. When switching between adjacent coarse segments, the DCO 510 may adjust the fine segments switched into the LC resonant circuit 510 based on the fine exchange rate. Similarly, because of the one hundred percent overlap of the coarse frequency-tuning array 530 with respect to a crude segment, the DCO 510 may switch between adjacent crude segments without recalibration. When switching between adjacent crude segments, the DCO 510 may adjust both coarse segments and fine segments that are switched into the LC resonant circuit 510. The coarse segments may be adjusted based on the coarse exchange rate. The fine segments may be adjusted based on the fine exchange rate.

In some embodiments, the DCO 500 may be part of a PLL and associated with a controller, such as the PLL 402 and the controller 420, respectively, of FIG. 4. In these and other embodiments, a loop filter in the PLL may provide the fine-tuning code and the controller may provide the crude and coarse-tuning codes.

Modifications, additions, or omissions may be made to the DCO 500 without departing from the scope of the present disclosure. For example, the DCO 500 may include one or more decoders. In these and other embodiments, the crude, coarse, and/or fine-tuning codes may each be configured as addresses and each received on a set of address lines. The one or more decoders may be configured to decode the crude, coarse, and/or fine-tuning codes. The DCO 500 may then use the decoded crude, coarse, and/or fine-tuning codes to switch crude, coarse, and fine segments into or out of the LC resonant circuit 510. In some embodiments, the DCO 500 may include additional frequency-tuning arrays. For example, the DCO 500 may include four, five, six, seven, eight, or more frequency-tuning arrays. Each of the additional tuning arrays may be configured so that there is one hundred percent overlap between adjacent tuning arrays. In these and other embodiments, exchange rates may be calculated for each pair of adjacent tuning arrays as discussed herein and used when adjusting between segments in the tuning arrays. Alternately or additionally, some or all of the additional tuning arrays may be configured so that there is not one hundred percent overlap between adjacent tuning arrays.

Figure 6:
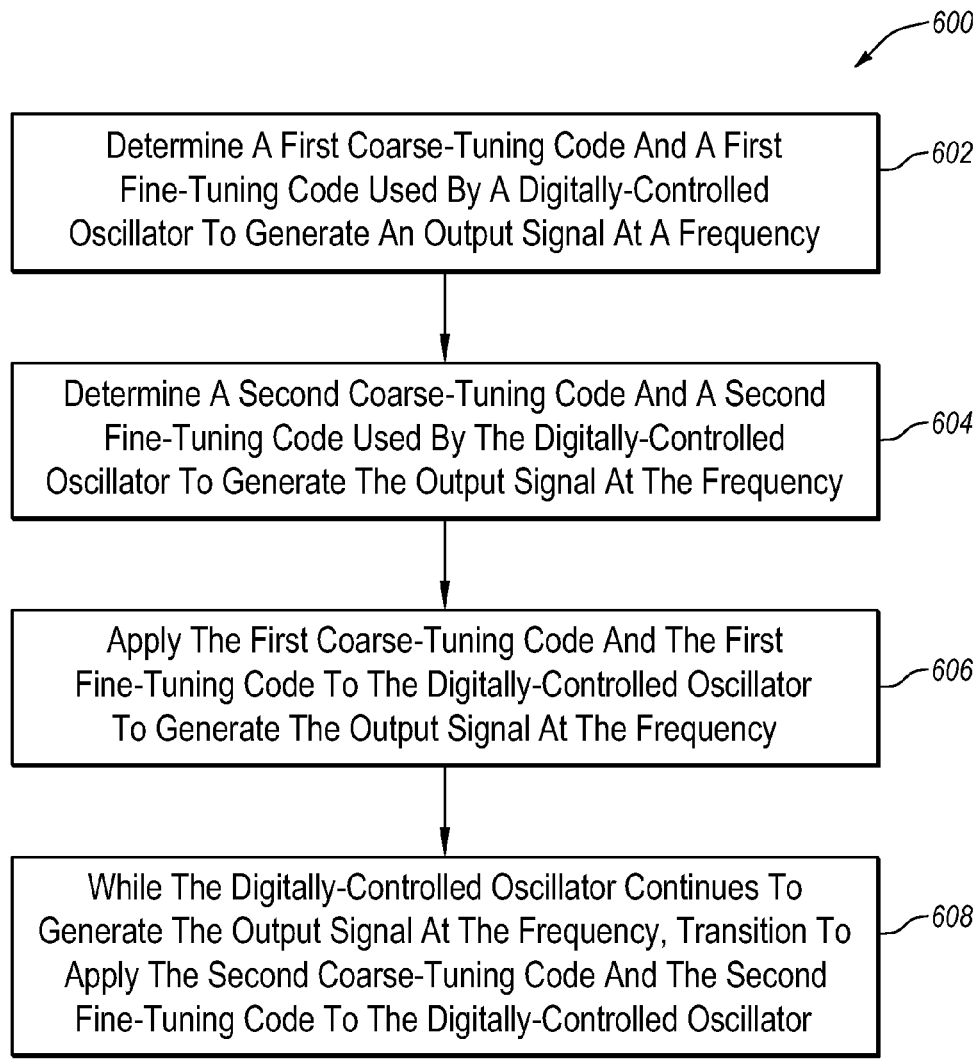
FIG. 6 is a flowchart of an example method of adjusting tuning segments in a DCO.

FIG. 6 is a flowchart of an example method 600 of adjusting tuning segments in a DCO, arranged in accordance with at least some embodiments described herein. The method 600 may be implemented, in some embodiments, by a circuit, such as the DCO 100 of FIG. 1, the circuit 400 of FIG. 4, and/or the DCO 500 of FIG. 5. Although illustrated as discrete blocks, various blocks may be divided into additional blocks, combined into fewer blocks, or eliminated, depending on the desired implementation.

The method 600 may begin at block 602, where a first coarse-tuning code and a first fine-tuning code used by a digitally-controlled oscillator to generate an output signal at a frequency may be determined.

In block 604, a second coarse-tuning code and a second fine-tuning code used by the digitally-controlled oscillator to generate the output signal at the frequency may be determined. In block 606, the first coarse-tuning code and the first fine-tuning code may be applied to the digitally-controlled oscillator to generate the output signal at the frequency.

In block 608, while the digitally-controlled oscillator continues to generate the output signal at the frequency, a transition to apply the second coarse-tuning code and the second fine-tuning code to the digitally-controlled oscillator may occur.

One skilled in the art will appreciate that, for this and other processes and methods disclosed herein, the functions performed in the processes and methods may be implemented in differing order. Furthermore, the outlined steps and operations are only provided as examples, and some of the steps and operations may be optional, combined into fewer steps and operations, or expanded into additional steps and operations without detracting from the essence of the disclosed embodiments.

For instance, the method 600 may further include determining an exchange rate between the first fine-tuning code and the second fine-tuning code. In some embodiments, the transitioning to apply the second fine-tuning code may include applying the exchange rate to the first fine-tuning code to obtain the second fine-tuning code.

The method 600 may further include determining a first and a second crude-tuning code used by a digitally-controlled oscillator to generate the output signal at the frequency. The first crude-tuning code may be applied to the digitally-controlled oscillator to generate the output signal at the frequency. The method 600 may further include transitioning to apply the second crude-tuning code, the second coarse-tuning code, and the second fine-tuning code to the digitally-controlled oscillator while the digitally-controlled oscillator continues to generate the output signal at the frequency.

In some embodiments, the method 600 may further include determining a fine exchange rate between the first fine-tuning code and the second fine-tuning code and a coarse exchange rate between the first coarse-tuning code and the second coarse-tuning code. In these and other embodiments, the transitioning to apply the second fine-tuning code may include applying the fine exchange rate to the first fine-tuning code to obtain the second fine-tuning code. Alternately or additionally, the transitioning to apply the second coarse-tuning code may include applying the coarse exchange rate to the first coarse-tuning code to obtain the second coarse-tuning code.

Figure 7:
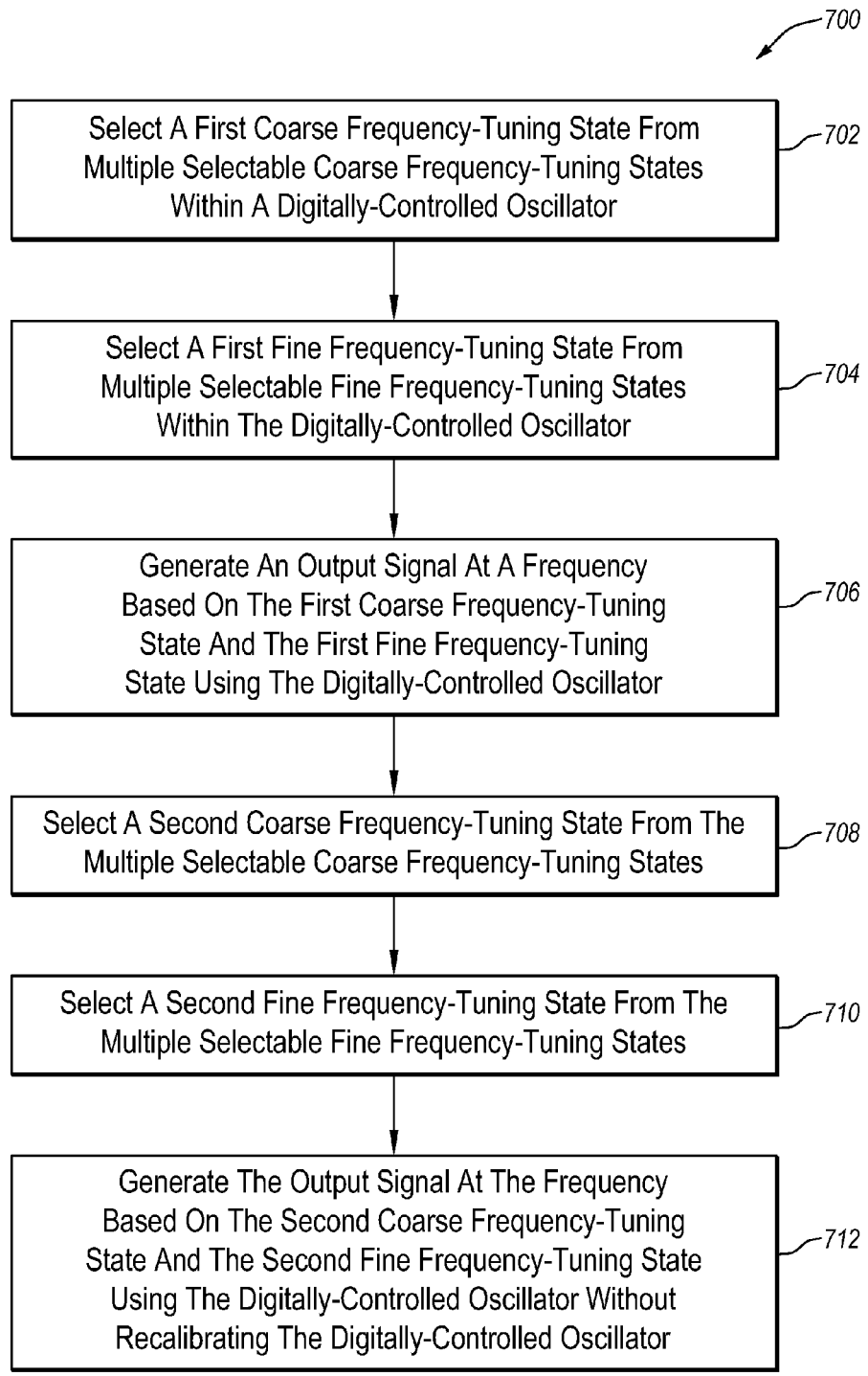
FIG. 7 is a flowchart of another example method of adjusting tuning segments in a DCO.

FIG. 7 is a flowchart of another example method 700 of adjusting tuning segments in a DCO, arranged in accordance with at least some embodiments described herein. The method 700 may be implemented, in some embodiments, by a circuit, such as the DCO 100 of FIG. 1, the circuit 400 of FIG. 4, and/or the DCO 500 of FIG. 5. Although illustrated as discrete blocks, various blocks may be divided into additional blocks, combined into fewer blocks, or eliminated, depending on the desired implementation.

The method 700 may begin at block 702, where a first coarse frequency-tuning state may be selected from multiple selectable coarse frequency-tuning states within a digitally-controlled oscillator.

In block 704, a first fine frequency-tuning state may be selected from multiple selectable fine frequency-tuning states within the digitally-controlled oscillator. In block 706, an output signal at a frequency based on the first coarse frequency-tuning state and the first fine frequency-tuning state may be generated using the digitally-controlled oscillator.

In block 708, a second coarse frequency-tuning state from the multiple selectable coarse frequency-tuning states may be selected. In some embodiments, the second coarse frequency-tuning state may be adjacent to the first coarse frequency-tuning state within the multiple selectable coarse frequency-tuning states.

In block 710, a second fine frequency-tuning state from the multiple selectable fine frequency-tuning states may be selected. In some embodiments, selecting the second fine frequency-tuning state may be based on the first fine frequency-tuning state and an exchange rate. The exchange rate may be calculated based on the frequency of the output signal.

In some embodiments, when a first frequency range of the first coarse frequency-tuning state is higher than a second frequency range of the second coarse frequency-tuning state, the selecting the second fine frequency-tuning state may be based on subtracting the exchange rate from the first fine frequency-tuning state. Alternately or additionally, when a first frequency range of the first coarse frequency-tuning state is lower than a second frequency range of the second coarse frequency-tuning state, the selecting the second fine frequency-tuning state may be based on adding the exchange rate to the first fine frequency-tuning state.

In block 712, the output signal at the frequency may be generated based on the second coarse frequency-tuning state and the second fine frequency-tuning state using the digitally-controlled oscillator without recalibrating the digitally-controlled oscillator.

Although the subject matter herein has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

All examples and conditional language recited herein are intended for pedagogical objects to aid the reader in understanding the invention and the concepts contributed by the inventor to furthering the art, and are to be construed as being without limitation to such specifically recited examples and conditions. Although embodiments of the present inventions have been described in detail, it should be understood that the various changes, substitutions, and alterations could be made hereto without departing from the spirit and scope of the invention.

What is claimed is:

1. A method of adjusting tuning segments in a digitally controlled oscillator, the method comprising:
   determining a frequency from a plurality of frequency settings, wherein each of the plurality of frequency settings corresponds to at least two combinations of selectable coarse-frequency tuning segments and selectable fine frequency tuning segments;
   selecting a first coarse-tuning code used by a digitally-controlled oscillator;
   calibrating the digitally controlled oscillator to determine a first fine-tuning code used, with the first coarse-tuning code, by the digitally-controlled oscillator, to generate an output signal at the frequency;
   selecting a second coarse-tuning code used by the digitally-controlled oscillator;
   recalibrating the digitally controlled oscillator to determine a second fine-tuning code used, with the second coarse-tuning code, by the digitally-controlled oscillator to generate the output signal at the frequency;
   calculating a fine-tuning exchange rate based on the determined first fine-tuning code and the determined second fine-tuning code, the fine-tuning exchange rate equal to a number of fine-tuning codes between the first fine-tuning code and the second fine-tuning code;
   applying the first coarse-tuning code to a coarse frequency-tuning array of the digitally controlled oscillator, and the first fine-tuning code to a fine frequency-tuning array of the digitally-controlled oscillator, to generate the output signal at the frequency; and
   transitioning to apply the second coarse-tuning code to the coarse frequency-tuning array and the second fine-tuning code to the fine frequency-tuning array, wherein the transitioning comprises:
   applying the second coarse-tuning code;
   determining the second fine-tuning code based on the first fine-tuning code and the previously calculated exchange rate; and
   applying the second fine-tuning code;
   wherein the digitally controlled oscillator continues to generate the output signal at the frequency across the transitioning without recalibrating the digitally controlled oscillator during the transitioning.

2. The method of claim 1, further comprising determining a first and a second crude-tuning code used by a digitally-controlled oscillator to generate the output signal at the frequency.

3. The method of claim 2, further comprising applying the first crude-tuning code to the digitally-controlled oscillator to generate the output signal at the frequency.

4. The method of claim 3, further comprising while the digitally-controlled oscillator continues to generate the output signal at the frequency, transitioning to apply the second crude-tuning code, the second coarse-tuning code, and the second fine-tuning code to the digitally-controlled oscillator.

5. The method of claim 4, further comprising determining a coarse exchange rate between the first coarse-tuning code and the second coarse-tuning code.

6. The method of claim 5, wherein the transitioning to apply the second coarse-tuning code includes applying the coarse exchange rate to the first coarse-tuning code to obtain the second coarse-tuning code.

7. The method of claim 1, wherein the second coarse-tuning code is adjacent to the first coarse-tuning code within a plurality of selectable coarse frequency-tuning codes.

8. The method of claim 1, wherein a first frequency range associated with the first coarse-tuning code is higher than a second frequency range associated with the second coarse-tuning code, and the selecting the second fine-tuning code is based on subtracting the exchange rate from the first fine-tuning code.

9. The method of claim 1, wherein a first frequency range associated with the first coarse-tuning code is lower than a second frequency range associated with the second coarse-tuning code, and the selecting the second fine-tuning code is based on adding the exchange rate to the first fine-tuning code.

* * * * *